United States Patent
Nguyen et al.

(10) Patent No.: US 6,858,085 B1
(45) Date of Patent: Feb. 22, 2005

(54) TWO-COMPARTMENT CHAMBER FOR SEQUENTIAL PROCESSING

(75) Inventors: Tue Nguyen, Fremont, CA (US); Tai Dung Nguyen, Fremont, CA (US); Craig Alan Bercaw, Los Gatos, CA (US)

(73) Assignee: Tegal Corporation, Petaluma, CA (US)

( * ) Notice: Subject to any disclaimer, the term of this patent is extended or adjusted under 35 U.S.C. 154(b) by 0 days.

(21) Appl. No.: 10/213,003

(22) Filed: Aug. 6, 2002

(51) Int. Cl.⁷ .................. C23C 16/00; C23C 14/00; B65G 49/07; C23F 1/00; H01L 21/306

(52) U.S. Cl. ............ 118/719; 118/723 R; 118/733; 414/217; 414/939; 156/345.31; 204/298.25; 204/298.26; 204/298.27; 204/298.28; 204/298.35

(58) Field of Search ............. 204/298.25–298.28, 204/298.35; 118/733, 719; 156/345.31, 345.32; 414/939

(56) References Cited

U.S. PATENT DOCUMENTS

| | | | | |
|---|---|---|---|---|
| 4,816,098 A | * | 3/1989 | Davis et al. ......... 156/345.31 |
| 5,468,341 A | | 11/1995 | Samukawa |
| 5,562,800 A | * | 10/1996 | Kawamura et al. ....... 414/806 |
| 5,759,334 A | * | 6/1998 | Kojima et al. ......... 156/345.31 |
| 5,916,365 A | | 6/1999 | Sherman |
| 5,993,556 A | * | 11/1999 | Maidhof et al. ........... 118/719 |
| 6,001,736 A | * | 12/1999 | Kondo et al. ............. 438/677 |
| 6,200,893 B1 | | 3/2001 | Sneh |
| 6,395,094 B1 | * | 5/2002 | Tanaka et al. ............ 118/719 |
| 6,398,475 B1 | * | 6/2002 | Ishikawa .................. 414/217 |
| 6,402,126 B2 | * | 6/2002 | Vaartstra et al. .......... 261/141 |
| 2003/0003767 A1 | * | 1/2003 | Kim et al. ................ 438/763 |

FOREIGN PATENT DOCUMENTS

| | | | | |
|---|---|---|---|---|
| EP | 1146141 A2 | * | 10/2001 | .......... C23C/16/40 |
| JP | 04116173 A | * | 4/1992 | .......... C23C/16/50 |
| JP | 07142408 A | * | 6/1995 | ......... H01L/21/205 |
| JP | 09003650 A | * | 1/1997 | .......... C23C/16/44 |
| JP | 10083965 A | * | 3/1998 | ......... H01L/21/205 |

* cited by examiner

*Primary Examiner*—Parviz Hassanzadeh
*Assistant Examiner*—Karla Moore
(74) *Attorney, Agent, or Firm*—Fliesler Meyer LLP

(57) ABSTRACT

An apparatus for sequential and isolated processing of a workpiece comprises a two compartment chamber and a mechanism to transfer the workpiece from one compartment to the other compartment. The transfer mechanism comprises two doors that seal the pathway between the two compartments between movement so that the two compartments are isolated and the workpiece can be processed sequentially and isolatedly in each compartment. The apparatus further comprises components to enable the processing of a workpiece: a delivery system to delivery precursor, a plasma source to generate a plasma and a vacuum pump to maintain a sub-atmospheric pressure. The preferred method of processing a workpiece is to deposit or adsorb a thin layer in the first compartment and then to transfer the workpiece to the second compartment for a reaction or a plasma reaction on the existing thin layer.

34 Claims, 8 Drawing Sheets

TWO-COMPARTMENT CHAMBER FOR SEQUENTIAL PROCESSING

BACKGROUND

The present invention relates to sequential thin film processing.

The fabrication of modern semiconductor workpiece structures has traditionally relied on plasma processing in a variety of operations such as etching and deposition. Plasma etching involves using chemically active atoms or energetic ions to remove material from a substrate. Deposition techniques employing plasma include Chemical Vapor Deposition (CVD) and Physical Vapor Deposition (PVD) or sputtering. PVD uses a high vacuum apparatus and generated plasma that sputters atoms or clusters of atoms toward the surface of the wafer substrates. PVD is a line of sight deposition process that is more difficult to achieve conformal film deposition over complex topography such as deposition of a thin and uniform liner or barrier layer over the small trench or via of 0.13 $\mu$m or less, especially with high aspect ratio greater than 4:1. Plasma generation methods include parallel plate plasma, inductive coupled plasma (ICP), remote plasma, and microwave plasma. In parallel plate plasma, a power source is applied across two parallel plates to create an electric field which will ionize the gas to generate the plasma. The plasma is confined between the parallel plates where the electric field is strongest, and there is significant plasma bombardment due to the presence of the electric field. In inductive coupled plasma, a power source is applied to a coil to create a magnetic field which will ionize the gas to generate the plasma. A non-conducting window such as ceramic plate could be used to separate the plasma source from the plasma. Care should be taken so that no metal is deposited on the non-conducting window, otherwise the deposited metal will block the magnetic field, and the plasma will be extinguished. This is the reason why inductive coupled plasma was not used for metal deposition. Typical parallel plate plasma and inductive coupled plasma use radio frequency (RF) power sources. In remote plasma, a plasma is generated elsewhere and then being brought to the process chamber. In microwave plasma, the plasma uses microwave frequency (MW) power source. Microwave plasma tends to be remote plasma, and is brought to the process chamber using a microwave guide.

In CVD processing, a gas or vapor mixture is flowed over the wafer surface that is kept at an elevated temperature. Reactions then take place at the hot surface where deposition takes place. The temperature of the wafer surface is an important factor in CVD deposition; the temperature used depends on the chemistry of the precursor for deposition and affects the uniformity of deposition over the large wafer surface. CVD typically requires high temperature for deposition which may not be compatible with other processes in the semiconductor process. CVD at lower temperature tends to produce low quality films in terms of uniformity and impurities.

In a deposition technology that is similar to the CVD technique and is known as atomic layer deposition (ALD), various gases are injected into the chamber for as short as 100–500 milliseconds in alternating sequences. For example, a first gas is delivered into the chamber for about 500 milliseconds and the substrate is heated, thereafter the first gas (heat optional) is turned off. The residue from the first gas is then evacuated. Another gas is delivered into the chamber for another 500 milliseconds (heat optional). The residue from this gas is also evacuated before the next gas is delivered for about 500 milliseconds (and optionally heated). This sequence is complete when all gases have been cycled through the chamber; each gas sequence typically forms a monolayer which is highly conformal. ALD technology thus have pulses gas injection and heating sequences that are between 100 and 500 milliseconds. This approach has a high dissociation energy requirement to break the bonds in the various precursor gases such as silane and oxygen and thus requires the substrate to be heated to a high temperature, for example in the order of 600–800 degree Celsius for silane and oxygen processes.

ALD also uses radical generators, such as plasma generators, to increase the reactivity of the second gas and effectiveness the reaction between the first and the second gases at the substrate. U.S. Pat. No. 5,916,365 to Sherman entitled "Sequential chemical vapor deposition" provides for sequential chemical vapor deposition by employing a reactor operated at low pressure, a pump to remove excess reactants, and a line to introduce gas into the reactor through a valve. Sherman exposes a part to be coated to a gaseous first reactant, including a non-semiconductor element of the thin film to be formed, wherein the first reactant adsorbs on the part. The Sherman process produces sub-monolayer per gas injection due to adsorption. The first reactant forms a monolayer on the part to be coated (after multiple cycles), while the second reactant passes through a radical generator which partially decomposes or activates the second reactant into a gaseous radical before it impinges on the monolayer. This second reactant does not necessarily form a monolayer but is available to react with the deposited monolayer. A pump removes the excess second reactant and reaction products thus completing the process cycle. The process cycle can be repeated to grow the desired thickness of film.

There are other applications that use plasma in ALD processes. U.S. Pat. No. 6,200,893 to Sneh entitled "Radical-assisted sequential CVD" discusses a method for CVD deposition on a substrate wherein radical species are used in alternate steps to depositions from a molecular precursor to treat the material deposited from the molecular precursor and to prepare the substrate surface with a reactive chemical in preparation for the next molecular precursor step. By repetitive cycles a composite integrated film is produced. In a preferred embodiment the depositions from the molecular precursor are metals, and the radicals in the alternate steps are used to remove the ligands left from the metal precursor reactions, and to oxidize or nitride the metal surface in subsequent layers.

In one embodiment taught by Sneh, a metal is deposited on a substrate surface in a deposition chamber by (a) depositing a monolayer of metal on the substrate surface by flowing a molecular precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with an inert gas; (d) flowing at least one radical species into the chamber and over the surface, the radical species is highly reactive with the surface ligands of the metal precursor layer and eliminates the ligands as reaction product, and saturates the surface, providing the first reactive species; and (e) repeating the steps in order until a metallic film of desired thickness results.

In another Sneh aspect, a metal nitride is deposited on a substrate surface in a deposition chamber by (a) depositing a monolayer of metal on the substrate surface by flowing a metal precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the atomic species highly reactive with the surface ligands of the metal precursor layer and eliminating the ligands as reaction product and also saturating the surface; (e) flowing radical nitrogen into the chamber to combine with the metal monolayer deposited in step (a), forming a nitride of the metal; (f) flowing a third radical species into the chamber terminating the surface with the first reactive species in preparation for a next metal deposition step; and (g) repeating the steps in order until a composite film of desired thickness results.

The Sneh embodiments thus deposit monolayers, one at a time. This process is relatively time-consuming as a thick film is desired.

Another application of sequential deposition is nanolayer thick film deposition (NLD) which is disclosed in U.S. patent application Ser. No. 09/954,244 on Sep. 10, 2001 Nguyen et al. NLD is a process of depositing a thin film by chemical vapor deposition, including the steps of evacuating a chamber of gases, exposing a workpiece to a gaseous first reactant, wherein the first reactant deposits on the workpiece to form the thin film, then evacuating the chamber of gases, and exposing the workpiece, coated with the first reactant, to a gaseous second reactant under plasma, wherein the thin film deposited by the first reactant is treated to form the same materials or a different material.

In comparison with CVD, atomic layer deposition (ALD or ALCVD) is a modified CVD process that is temperature sensitive and flux independent. ALD is based on self-limiting surface reactions. ALD provides a uniform deposition over complex topography and temperature independent since the gases are adsorbed onto the surface at lower temperature than CVD because it is in adsorption regime.

As discussed in Sherman and Sneh, the ALD process includes cycles of flowing gas reactant into the chamber, adsorbing one sub-monolayer onto the wafer surface, purging the gas reactant, flowing a second gas reactant into the chamber, and reacting the second gas reactant with the first gas reactant to form a monolayer on the wafer substrate. Thick film is achieved by deposition through multiple cycles.

Precise thickness can be controlled by regulating number of cycles used since a monolayer is deposited per cycle. However, the conventional ALD method is slow in depositing films such as those around 100 angstroms in thickness. Growth rate of ALD TiN for example was reported at 0.2 angstrom/cycle, which is typical of metal nitrides from corresponding chlorides and $NH_3$.

The throughput in workpiece fabrication for a conventional ALD system is slow. Even if the chamber is designed with minimal volume, the throughput is still slow due to the large number of cycles required to achieve the thickness. The pump/purge cycle between gases is very time consuming, especially with liquid or solid vapors. Conventional ALD is a slower process than that of CVD with a rate of deposition that is almost 10 times as slow as CVD deposition. The process is also chemical dependent to have the proper self-limiting surface reaction for deposition. To improve the throughput, a batch system has been developed to process many wafers at the same time.

As with other sequential processing methods, the precursor gases or vapors are introduced sequentially with a pump/purge step in-between to ensure the complete removal of the precursor. This pump/purge step does not contribute to the film process, therefore it is desirable to eliminate this step from the processing sequence.

SUMMARY

Accordingly, a two-compartment chamber apparatus for sequential and isolated processing is disclosed.

In one aspect of the present invention, the two-compartment apparatus is used in sequential processing of a workpiece without the pump/purge step. The processing chamber comprises two compartments: the first compartment to process the workpiece using first precursors or reactants and the second compartment to process the workpiece using second precursors or reactants. These two compartments are separated by an internal pathway to allow the passage of the workpiece from one compartment to the other compartment. Instead of a pump/purge step to separate the precursors in the one-compartment chamber as in prior art methods, the present invention two-compartment chamber apparatus moves the workpiece between the compartments. The moving mechanism comprises a workpiece mover for supporting the workpiece during the movement. The moving mechanism further comprises an actuator, such as a motor, coupled to the workpiece mover to move the workpiece from one compartment to the other compartment. The moving mechanism has two end positions, at each end position, the workpiece is located in each compartment. There are two pathway doors coupled at the two ends of the workpiece mover. The pathway doors are coupled to the workpiece mover in such a way that one of the pathway doors closes the internal pathway between the two compartments in each end position of the moving mechanism. As such, the pathway doors ensure the isolation of the compartments for processing and prevent cross contamination from the other compartment. Since the two pathway doors are coupled to the workpiece mover, one of the pathway doors automatically closes the pathway between the compartments after the workpiece has moved completely to an end position.

A typical sequential processing comprises the following steps:

a) A workpiece is introduced into the first compartment. The workpiece mover is at its end position, so one of the pathway doors automatically closes the internal pathway to isolate the two compartment, thus preventing the first compartment precursors or reactants from diffusing into the second compartment and contaminating the second compartment, and vice versa.

b) The workpiece is processed in the first compartment.

c) After processing is finished in the first compartment, the workpiece is moved to the second compartment until the workpiece mover is at its other end position, so one of the pathway doors automatically closes the internal pathway to isolate the two compartment, thus preventing the second compartment precursors or reactants from diffusing into the first compartment and contaminating the first compartment, and vice versa.

d) The workpiece is processed in the second compartment.

e) After processing is finished in the second compartment, the workpiece is moved to the first compartment. The sequence is then repeated until the workpiece processing is complete.

During the workpiece transfer, the pathway door is opened and the two compartments are connected and a small amount of cross contamination occurs. Depending on the process requirements, a short pumping time after the completion of the workpiece transfer might be needed to remove the cross contamination. In any case, the short pumping time is shorter than the pump/purge step of the prior art. With a two-compartment chamber, compartment cleaning can be selective. For example, if one compartment is used for deposition and the another for treatment, only the deposition compartment needs to be cleaned.

The processing of the workpiece can be for deposition of a thin film, or adsorption of a sub-monolayer of a plurality of precursors or reactants, or etching of a thin layer, or a reaction, with or without an exciting source such as a plasma source, of a plurality of precursors or reactants onto the existing layers on the workpiece.

Implementations of the above aspect may include one or more of the following.

The two pathway doors coupled to the workpiece mover can be equal or smaller than the internal pathway opening. In this way the workpiece mover can reside completely in one of the compartments, and the pathway door can go across the internal pathway. The advantage of this implementation is the simple design and the workpiece mover can travel widely. But the disadvantage is that the degree of isolation can be reduced if the gap between the pathway and the pathway door is too large. If the gap is too small, there can be friction, resulting in wear and tear, and possible particle generation.

The two pathway doors coupled to the workpiece mover can be larger than the internal pathway opening. Since the pathway doors are larger than the opening, the doors cannot travel across the internal pathway. Therefore the workpiece mover is positioned so that one pathway door resides within one compartment and the other pathway doors resides within the other compartment. Large pathway doors can provide better isolation for the two compartments. Better isolation can be achieved with the addition of o-rings so that the internal pathway closing is metal to o-ring seal instead of metal to metal seal.

A workpiece mover heater can be coupled to the workpiece mover. The workpiece mover heater is capable of heating the workpiece to an elevated temperature. Many processing techniques require that the workpiece be heated, from room temperature to around 400° in the cases of plasma processing, or 800° C. in the case of high temperature CVD, or 1200° C. as in the case of rapid thermal processing. The workpiece heater can provide the high temperature needed for these selected processing requirements. By coupling to the workpiece mover, the workpiece mover heater moves with the workpiece mover, therefore there is only one workpiece mover heater for the two-compartment chamber.

The movement of the workpiece mover from one compartment to the other compartment can be by rotational movement. The angle from the two pathway doors can be anywhere from a few degrees to a maximum of 180° apart, with roughly 90–100° as the desired angles to minimize the footprint of the process chamber.

The movement of the workpiece mover from one compartment to the other compartment can be by linear movement. The linear movement further comprises a linear guide coupled to the motor to guide the movement of the workpiece mover. The two pathway doors are positioned at the two ends of the movement.

The apparatus can further comprises a second actuator, such as a motor, coupled to a second linear guide to move the workpiece mover in a vertical direction somewhat perpendicular to the movement from one compartment to the other compartment. The vertical movement is designed to clear the workpiece mover of any obstacles during the compartment to compartment transfer.

The apparatus can further comprise an external pathway coupled to one of the compartment. The external pathway is designed to allow the passage of the workpiece to the outside of the workpiece processing chamber, and from the outside into the workpiece processing chamber. The external pathway can comprise an external door to isolate the process chamber from the outside ambient.

The apparatus can further comprise a plurality of workpiece heaters coupled to the processing chamber. There can be only one workpiece heater in only one compartment, or there can be two workpiece heaters, one for each compartment. The workpiece heaters are capable of heating the workpiece to an elevated temperature. The two workpiece heaters can be independent, so that one can achieve different temperatures. The workpiece heaters are part of the process requirements. Some processes require that the workpiece be heated to an elevated temperature, while other processes can run at room temperature and other processes need to run below room temperature. The workpiece heater can be radiative heater such as a lamp, or resistive heater. The workpiece heater can comprises a third actuator, such as a motor, coupled to a linear guide to move the workpiece heater in a vertical direction somewhat perpendicular to the compartment to compartment movement. This vertical movement is designed to clear the workpiece mover of any obstacles during the compartment to compartment transfer. The linear guide can be coupled to the workpiece heater, and the workpiece heater can move up or down to clear the path for the workpiece mover. The linear guide can be coupled to the workpiece mover, and the workpiece mover can move up or down to clear the workpiece heater during the transfer.

The apparatus can further comprise a plurality of delivery systems coupled to the processing chamber. There can be only one delivery system in only one compartment, or there can be two delivery systems, one for each compartment. The delivery systems are capable of delivering a plurality of precursors or reactants onto the workpiece. The delivery systems are part of the process requirements. The delivery system can be a liquid precursor delivery system to deliver a plurality of precursor vapors from a plurality of liquid precursor sources. The delivery system can be a solid precursor delivery system to deliver a plurality of precursor vapors from a plurality of solid precursor sources. The delivery system can be a showerhead to distribute the precursor vapor uniformly over a flat surface. The delivery system can be a ring to distribute the precursor vapor in a ring surrounding the workpiece. The delivery system can comprise a vaporizer to vaporize a liquid precursor or a solid precursor. The delivery system can comprise a liquid flow controller to control the amount of liquid precursor entering the process chamber. The delivery system can comprise a number of valves to control the timing of the precursor delivery.

The apparatus can further comprise a plurality of plasma sources coupled to the processing chamber. There can be only one plasma source in only one compartment, or there can be two plasma sources, one for each compartment. The plasma sources are capable of delivering a plasma onto the workpiece. The plasma sources are a part of the process requirements. The plasma can be used to excite the precursors, generating radical species, and increase the reaction rate. The plasma can be used for deposition processes, reaction processes, etching processes, or chamber clean processes. The plasma source can be an inductive coupled plasma (ICP) source using radio frequency (RF). The plasma source can be a parallel plate plasma source using radio frequency (RF). The plasma source can be a remote plasma source. The plasma source can be a microwave plasma source using microwave frequency (MW).

The apparatus can further comprise a plurality of vacuum pumps coupled to the processing chamber. There can be only one vacuum pumps in only one compartment, or there can be two vacuum pumps, one for each compartment. The vacuum pumps are capable of maintaining the processing chamber at a pressure lower than atmospheric pressure. The compartment can have an isolation valve to isolate the compartment from the vacuum pump. The compartment can have a throttle valve to regulate the pressure in the compartment.

The apparatus can further comprise a plurality of workpiece bias power sources coupled to the processing chamber. There can be only one workpiece bias power source in only one compartment, or there can be two workpiece bias power sources, one for each compartment. The workpiece bias power source can be a direct current (DC) bias source, or a RF bias source. The workpiece bias power source can provide a potential bias to the workpiece to modify the path of the charged precursors, to provide bombardment to the workpiece.

In a preferred embodiment, the present invention apparatus comprises a two-compartment process chamber for sequential processing of a workpiece. The processing chamber comprises two compartments with each compartment having the processing equipment to process the workpiece. The processing equipment comprises a heater for heating the workpiece to an elevated temperature since many process recipes require that the workpiece be at a high temperature. The processing equipment comprises vacuum pumps to keep the process chamber at a reduced pressure. Typical process pressures are in the milliTorr range for etching conditions, and in the Torr range for deposition conditions, with 760 Torr being the atmospheric pressure. There can be one vacuum pump connected to one of the compartments, or there can be one vacuum pump connected to both compartments, or there can be two vacuum pumps connected to two compartments of the process chamber. There can be isolation valves between the compartments and the vacuum pumps to isolate the compartments from the vacuum pumps. There can be throttle valves between the compartments and the vacuum pumps to regulate the pressure in the compartments. The processing equipment comprises delivery systems to deliver precursors onto the workpiece. There can be one delivery system in one compartment, or there can be two delivery systems, one for each compartment. The apparatus is for sequential processing of a workpiece using two precursors for two compartments. Instead of a pump/purge step between the two precursors, the workpiece is moved between the two compartments. This arrangement has significantly better advantages with liquid or solid precursors since the pump/purge step for vapors is much longer than gases in the prior art apparatus.

The apparatus can further comprise a plasma source, such as a microwave plasma source, to clean the compartment.

In another preferred embodiment, the present invention apparatus comprises a two-compartment process chamber for sequential processing of a workpiece with a plasma source. The processing chamber comprises two compartments with each compartment having the processing equipment to process the workpiece and one of the compartments having a plasma source for plasma processing. The processing equipment comprises a heater for heating the workpiece to an elevated temperature since many process recipes require that the workpiece be at a high temperature. The processing equipment comprises vacuum pumps to keep the process chamber at a reduced pressure. The processing equipment comprises delivery systems to deliver precursors onto the workpiece. The processing equipment comprises a plasma source for plasma processing of the workpiece.

The apparatus is for sequential processing of a workpiece using two precursors for two compartments with one compartment having a plasma source. The workpiece is exposed to the first precursor in the first compartment, then moves to the second compartment, and is exposed to a plasma environment with the second precursor in the second compartment. To initiate a plasma, the amount of vapor needs to be minimized, therefore this arrangement has significant advantages over the pump/purge step of the prior art. This arrangement is also well suited for metal deposition process with ICP plasma, since the first precursor, which is a metal precursor, will be confined in the first compartment, therefore the second compartment with the plasma is free of the metal precursor. For ICP plasma, the non-conductance window, such as a ceramic plate, needs to be free of metal for the transmission of the magnetic field for generating the plasma inside the compartment. The prior art one-compartment apparatus will require cleaning of the non-conductance window from the metal deposition for the reliable operation of the ICP plasma.

The apparatus can further comprise a plasma source, such as a microwave plasma source, to clean the first compartment.

In a co-pending application by the same authors, Tue Nguyen et al., entitled "Two-compartment chamber for sequential processing method", U.S. patent application Ser. No. 10/212,547, filed Aug. 6, 2002, discloses a method of sequential process of a workpiece. The method comprises the steps of:

a) processing the workpiece in a first compartment;

b) transferring the workpiece from the first compartment to a second compartment, the second compartment being isolated from the first compartment; and c) processing the workpiece in the second compartment.

The sequence can be repeated with the steps of transferring the workpiece back to the first compartment and processing the workpiece there. This sequential process method is different from the prior art sequential or ALD processing method in which the pump/purge step between the processing steps is replaced by a workpiece movement.

The workpiece processing step in step a) in the first compartment can comprise the deposition of a thin film. The characteristic of the deposition process is that the deposited film thickness increases noticeably as a function of processing time. The thin film deposition can occur by the introduction of appropriate precursors through a delivery system in the first compartment. By exposing the workpiece to appropriate precursors under appropriate conditions, a thin film can be deposited on the workpiece. The thickness of the deposited film can be from a monolayer to hundred of nanometers, and is controllable by various process conditions, such as the process time. A workpiece heater in the first compartment can supply the energy needed for the deposition reaction to take place. The workpiece heater can be a radiative heater or a resistive heater. A plasma or a bias source can also be added to supply the energy needed, or to modify the process characteristics. The process pressure can be sub-atmospheric, controlled by a throttle valve that is connected to a vacuum pump. The process pressure can be atmospheric, depending on the processes.

The workpiece processing step in step a) in the first compartment can comprise the adsorption of a thin film. The characteristic of an adsorption process is that the adsorbed film thickness does not in increase noticeably as a function of processing time. The adsorbed film saturates at a certain thickness, typical less than a monolayer, after a period of processing time. This adsorption characteristic which is characteristic of the ALD process, ensures very good conformality of the coated film and ensures consistent thickness with a wide process margin. The thickness of the adsorbed film is typically less than a monolayer, and is much more difficult to control than the deposited film.

The workpiece processing step in step c) in the second compartment can comprise the reaction of a precursor on the existing film. The workpiece processing step in step c) in the second compartment can comprise the plasma reaction of a precursor on the existing film. The existing film can be from a deposition step or from an adsorption process. The presence of the plasma can hasten the reaction process to improve the throughput. The deposited or adsorbed thin film is treated to form the same materials or a different material.

Implementations of the above aspect may include one or more of the following. The workpiece can be a wafer. The plasma enhances or maintains the thin film conformality. The plasma can be a high density plasma with higher than $5 \times 10^9$ ion/cm$^3$. The reactant can be a metal organic, or organic, to form a thin film of metal, metal nitride, or metal oxide. The second reactant can be exposed under high pressure above 100 mT. The first and second reactants react and the reaction creates a new compound. The thin film thickness is less than one atomic layer thick. The thin film thickness is more than one atomic layer thick. The thin film thickness can be between a fraction of a nanometer and tens of nanometers. The plasma can be sequentially pulsed for each layer to be deposited. The plasma can be excited with a solid state RF plasma source such as a helical ribbon electrode. The process includes pre-cleaning a surface of a workpiece; stabilizing precursor flow and pressure; exposing the workpiece to a first reactant in the first compartment, wherein the first reactant deposits or adsorbs onto the workpiece to form a thin film; transferring the workpiece to the second compartment; striking the plasma; performing a plasma treatment on the deposited or adsorbed film; exposing the workpiece, coated with the first reactant, to a gaseous second reactant under the plasma treatment, wherein the thin film deposited by the first reactant is treated to form the same materials or a different material. Repeating of the steps deposits a thick film with the thickness being controlled by the number repetitions.

In another aspect, an apparatus to perform semiconductor processing includes a high density inductive coupled plasma generator to generate plasma and a process compartment housing the plasma generator. The method can provide deposition of copper metal from Cu hfacI and plasma (gas), Cu hfacII and plasma (gas), CuI$_4$ and plasma (gas), CUCl$_4$ and plasma (gas), and organo metallic copper and plasma (gas); of titanium nitride from TDMAT and plasma (gas), TDEAT and plasma (gas), TMEAT and plasma (gas), TiCl$_4$ and plasma (gas), TiI$_4$ and plasma (gas), and organo metallic titanium and plasma (gas); of tantalum nitride from PDMAT and plasma (gas), PDEAT and plasma (gas), and organo metallic tantalum and plasma (gas); of aluminum oxide from trimethyl aluminum (TMA) and ozone, TMA and water vapor, TMA and oxygen, organo metallic aluminum and plasma (gas); and other oxides such as hafnium oxide, tantalum oxide, zirconium oxide; wherein gas is one of N$_2$, H$_2$, Ar, He, NH$_3$, and combination thereof.

Implementations of the apparatus can include gas distribution, chuck, vaporizer, pumping port to pump, and port for gas purge.

Advantages of the system may include one or more of the followings. The pump/purge step is minimized, especially with liquid precursors or reactants. There is no extensive pump/purge step to remove all the first precursors or reactants before introducing the second precursors or reactants because the first and second precursors or reactants are confined to different compartments. There can be a small amount of pump/purge to minimize the amount of cross contamination, occurring during the workpiece transfer, but this pump/purge step is significantly small. Another advantage is that the chamber cleaning step can be minimized. With the first and second precursors separated, the deposition occurring in the chamber wall is much reduced, therefore requiring less chamber wall cleaning. This is especially useful with metal deposition using ICP plasma, since the non-conducting window of the ICP plasma has to be cleaned of metal deposits. Another advantage is the improvement of uniformity because a showerhead can be used in the first compartment and an ICP plasma in the second compartment.

Other advantages of the system may include one or more of the followings. The ICP plasma can use a helical ribbon instead of a coil. The helical ribbon provides a highly uniform plasma and also results in a chamber with a small volume. The system enables high precision etching, deposition or sputtering performance. This is achieved using the pulse modulation of a radio frequency powered plasma source, which enables a tight control the radical production ratio in plasmas, the ion temperature and the charge accumulation. Also, since the time for accumulation of charges in a wafer is on the order of milli-seconds, the accumulation of charges to the wafer is suppressed by the pulse-modulated plasma on the order of micro-seconds, and this enables the suppression of damage to workpieces on the wafer caused by the charge accumulation and of notches created during the electrode etching process. The system requires that the substrate be heated to a relatively low temperature such as 400 degrees Celsius.

The compartment can be used for deposition step, such as CVD deposition, ALD deposition, plasma enhanced CVD deposition, metal organic CVD (MOCVD) deposition, sputtering deposition or used for a treatment step such as rapid thermal annealing, laser annealing, plasma annealing, desorption used or for etching step such as metal etch, oxide etch, atomic layer etch.

DESCRIPTION

Figure 1A:
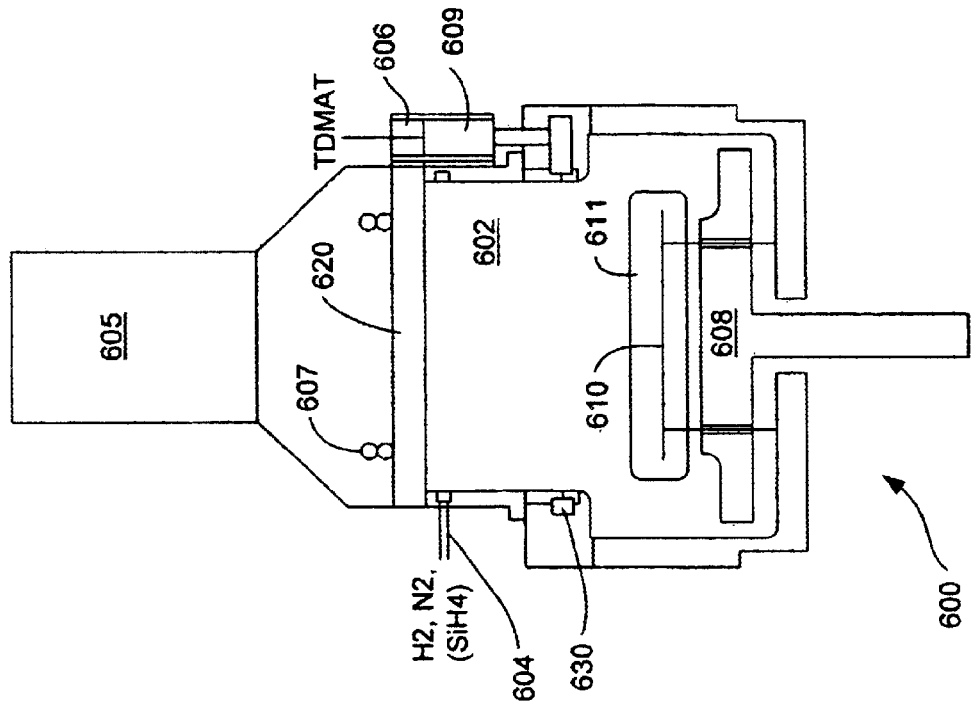
FIGS. 1A–1B show two operating conditions of a one-compartment chamber to perform plasma deposition.
Figure 1B:
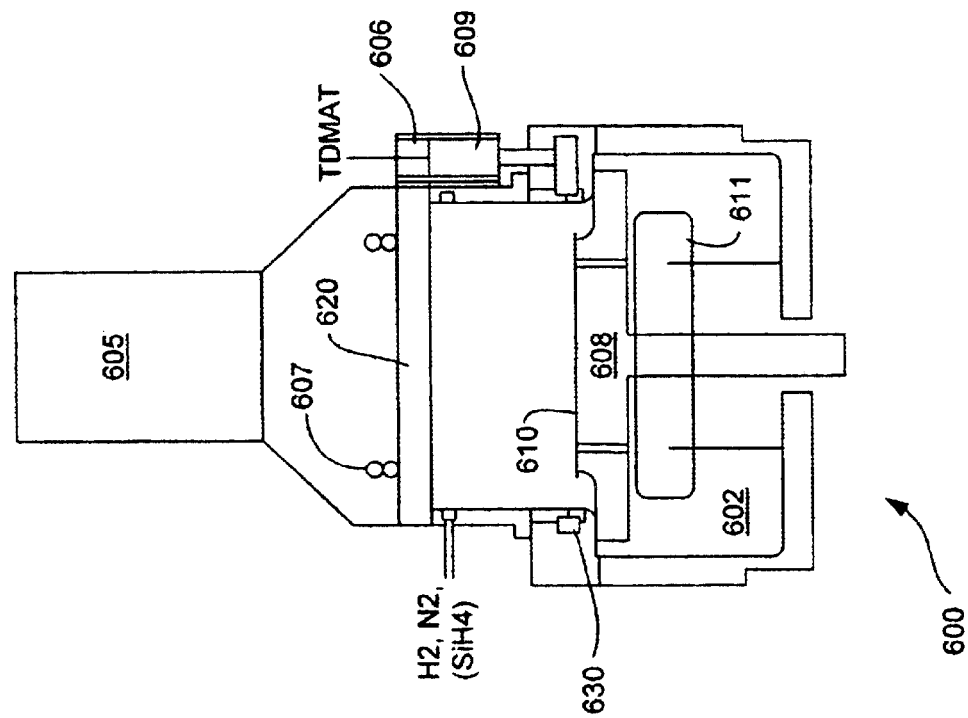

FIGS. 1A–1B show two operating conditions of an embodiment 600 to perform plasma sequential deposition as disclosed in a patent application Ser. No. 09/954,244 on Sep. 10, 2001 of the same authors, Tue Nguyen et al. FIG. 1A shows the embodiment 600 in a deposition condition, while FIG. 1B shows the embodiment 600 in a rest condition. A plasma generator 605 is mounted on top of the chamber 602 and one or more plasma excitation coils 607 are positioned near the gas inlets 604. The plasma generator configuration is an inductive coupled plasma (ICP), where a magnetic field is generated through the coil 607. The magnetic field excites the gas inside the chamber 602 to generate a plasma. A non-conductor window 620, such as a ceramic plate of alumimum oxide, seals the chamber against the outside atmosphere. The window 620 needs to be non-conducting to allow the passage of the magnetic field to generate the plasma inside the chamber 602. If a metal is deposited on the window 620, the magnetic field is blocked and the plasma generation will be affected. The plasma can be extinguished if there is too much metal blocking. This system requires a cleaning procedure to ensure that the window 620 is free of metal deposits.

The chamber 602 receives precursor gases through one or more gas inlets 604. A liquid precursor system 606 introduces liquid precursor through a vaporizer 609 into the chamber 602 using a precursor distribution ring 630.

A chuck 608 movably supports a workpiece or a substrate 610. In FIG. 1A, the chuck 608 and the substrate 610 are elevated and ready for deposition. The chamber 602 is maintained at sub-atmospheric pressure with the use of a vacuum pump (not shown). The substrate 610 can be heated using radiative heating or resistive heating through the chuck 608. Suitable processing gas is introduced into the chamber through the inlets 604, and a plasma generator 605 is turned on in accordance with a process recipe to drive the desired process. At the end of the processing, the gases in the chamber 602 are purged, the chuck 608 is lowered and the substrate 610 is removed through an opening 611.

The sequential process can be accomplished with a pump/purge step. A first precursor is introduced and the substrate is exposed to the first precursor to form a thin film. A pump/purge step is followed to remove the first precursor. Then a second precursor is introduced and the substrate is exposed to the second precursor to react with the existing thin film. In the plasma sequential chamber, a plasma is generated during the introduction of the second precursor to accelerate the reaction. Another pump/purge step then follows to remove the second precursor. Then the sequence is repeated until the process is completed. To generate a plasma, the chamber needs to be free of precursor vapor, therefore a long pump/purge cycle is often needed. Also, to achieve a high density plasma in a large uniform area, such as for a 8" diameter semiconductor wafer, ICP plasma is the obvious choice. But to generate the plasma, the window needs to be free of metal deposit. Therefore for a metal deposition sequence, a window clean step will need to be included. The throughput of the process is significantly reduced with these pump/purge and cleaning actions.

Figure 2:
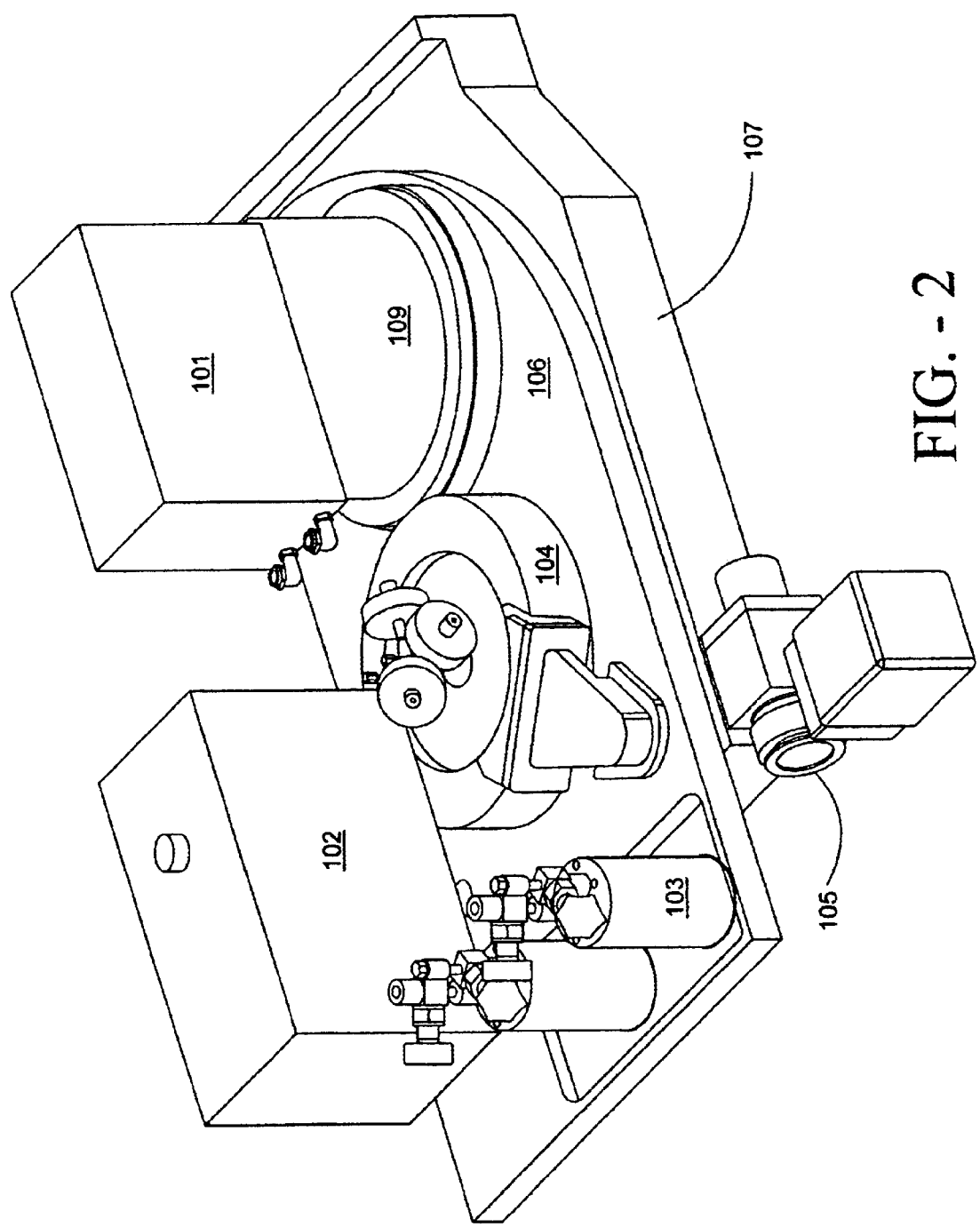
FIG. 2 shows a different view of an embodiment of the present invention two-compartment chamber.

FIG. 2 shows a different view of an embodiment of the present invention two-compartment chamber. Referring to FIG. 2, the two-compartment chamber comprises a chamber bottom 107 and a chamber lid 106. The chamber lid 106 and the chamber bottom 107 can be separated to expose the inside of the process chamber for servicing. In one aspect, the chamber bottom 107 is fixed and the chamber lid 106 is movable. Connections to the chamber lid 106 are made through the chamber bottom 107 to prevent breaking connections when the chamber lid 106 is moving. The vacuum connection 105 is attached to the chamber bottom 107. There is a connection between the chamber bottom and the chamber lid to connect the vacuum port to the compartment. The chamber comprises two compartments 104 and 109. Compartment 104 has a delivery system using a liquid precursor 103. Compartment 109 has a plasma source 101 to generate reactive precursors. Compartment 104 further has a downstream plasma source 102, preferably a microwave plasma, for chamber cleaning.

Figure 3:
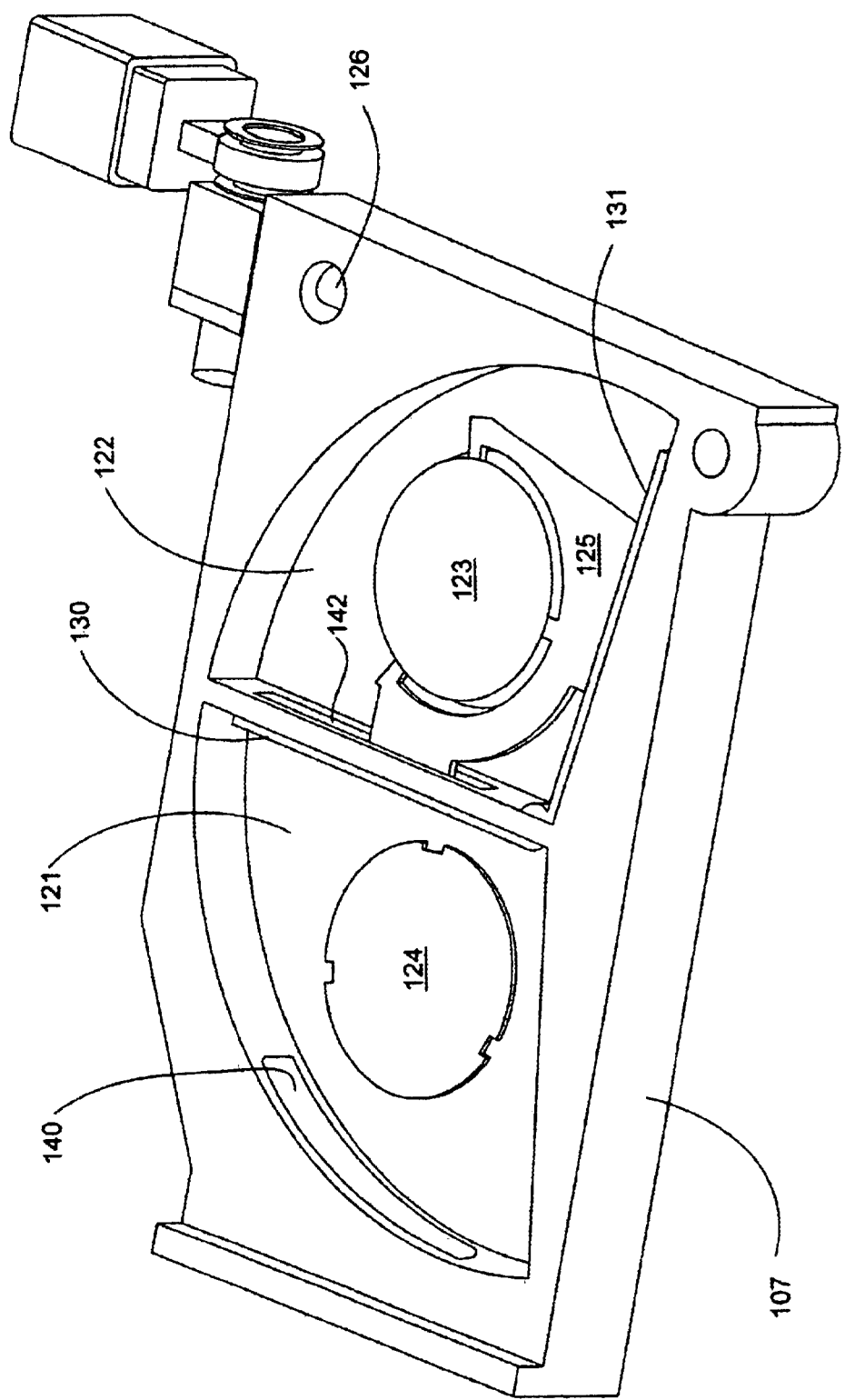
FIG. 3 shows a chamber bottom of the two-compartment chamber.

FIG. 3 shows a chamber bottom of the two-compartment chamber. The chamber bottom 107 has a vacuum connection 126. In this particular design, the vacuum connection 126 is connected to the chamber lid (not shown), and then connected to the cavity of the compartments (not shown). The chamber bottom 107 has an external pathway 140 to move a workpiece 123 in and out of the chamber. The chamber bottom 107 comprises two compartments 121 and 122. The two compartments 121 and 122 are separated by an internal pathway 142. The internal pathway 142 is large enough for the passage of a workpiece 123. The workpiece 123 is supported by a workpiece mover 125. The workpiece mover 125 is connected with two pathway doors 130 and 131. In this design, the pathway doors 130 and 131 are larger than the internal pathway 142, therefore one pathway door 130 is located in one compartment 121, and one pathway door 131 is located in other compartment 122. In this design, a workpiece heater 124 is coupled to the compartment 121 to provide heat to the workpiece 123. Another workpiece heater (not visible) under the workpiece 123 is providing heat to the workpiece 123 in the compartment 122. The compartment 122 is isolated from compartment 121 by the pathway door 130. The workpiece mover 125 can move the workpiece 123 from compartment 122 to compartment 121 by rotating counterclockwise. In the new position, pathway door 131 will close the internal pathway 142, and the two compartments will be isolated again.

Figure 4:
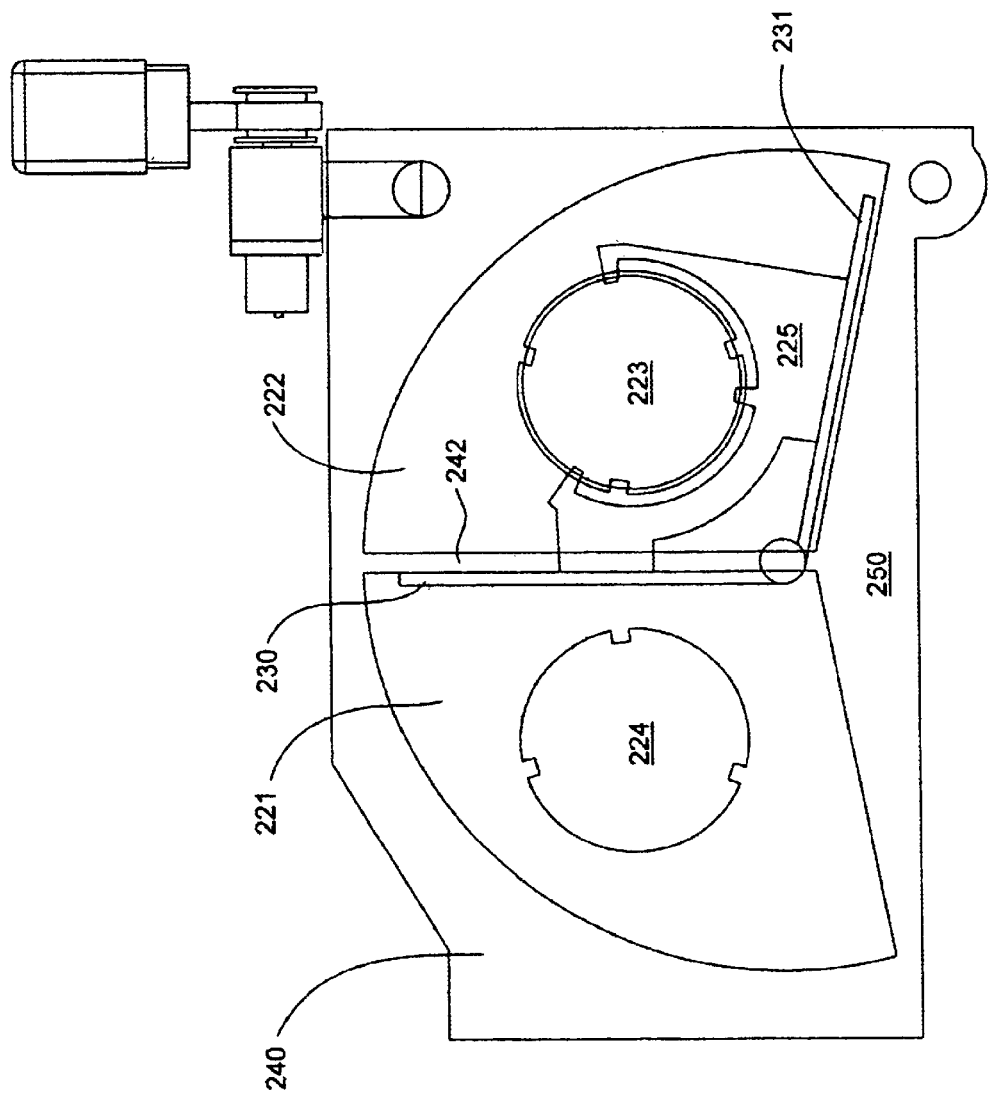
FIG. 4 shows a top view of the chamber bottom.

FIG. 4 shows a top view of the chamber bottom 250. There are two compartments 221 and 222 with a internal pathway 242. The workpiece mover 225 is supporting the workpiece 223 and is located in compartment 222. Two pathway doors 230 and 231 are coupled to the workpiece mover 225. The pathway door 230 closes the internal pathway 242 in the shown position. By rotating counterclockwise, the workpiece mover 225 can move the workpiece 223 from compartment 222 to compartment 221. In compartment 221, the pathway door 231 will close the internal pathway 242. In either position, the two compartments are isolated. Also shown are a workpiece heater 224 and an external pathway 240, both coupled to compartment 221.

Figure 5:
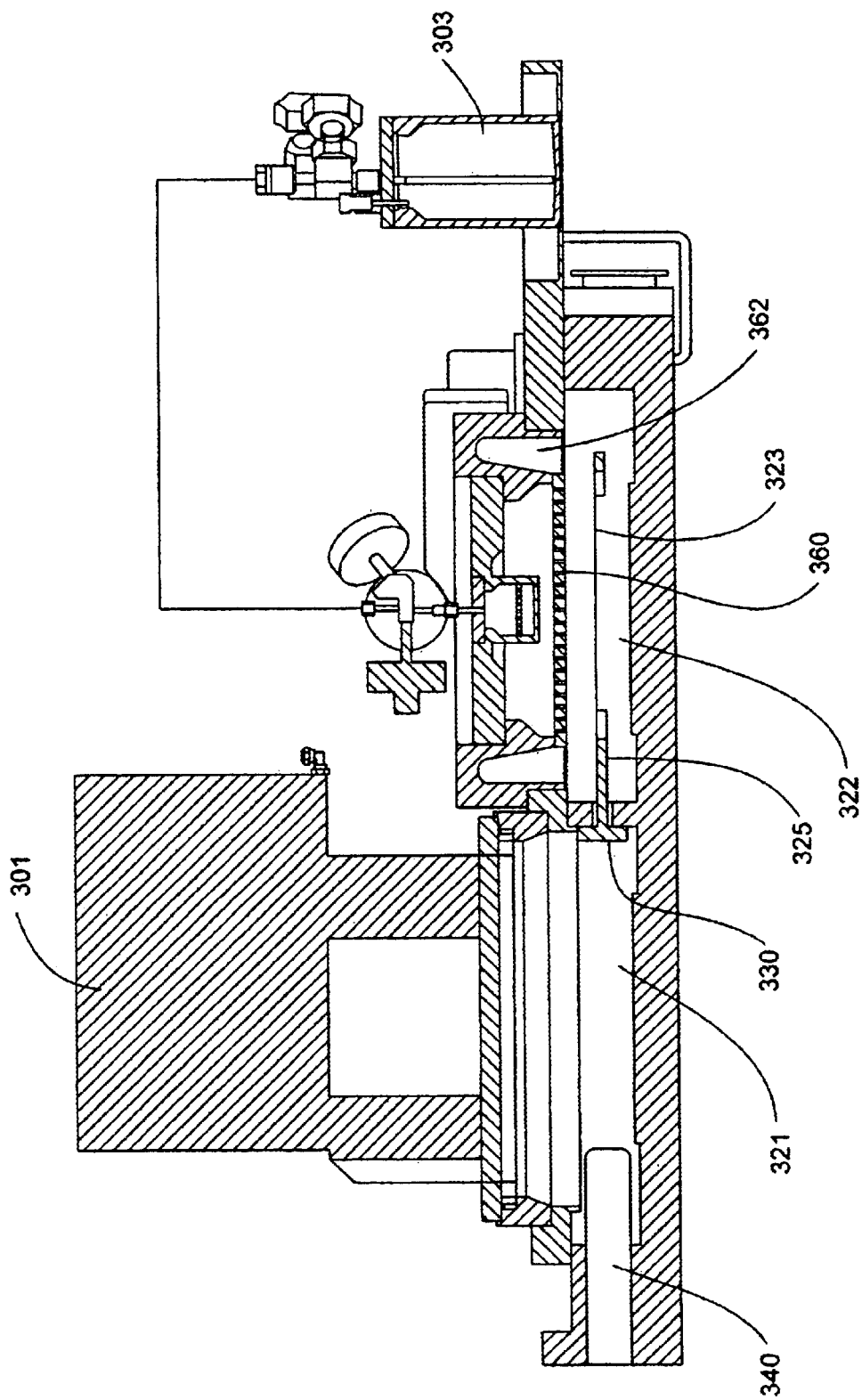
FIG. 5 shows a cross section of the two compartment chamber.

FIG. 5 shows a cross section of the two compartment chamber. The chamber comprises two compartments 321 and 322. A workpiece 323 is supported by a workpiece mover 325 and located in compartment 322. A pathway door 330 coupled to the workpiece mover 325 closes the internal pathway between the two compartments 321 and 322. A liquid precursor 303 can deliver a precursor vapor to a showerhead 360 and onto the workpiece 323. A vacuum section 362 can evacuate the gases and vapor in the compartment 322. In compartment 321, a ICP plasma source 301 can generate a plasma in compartment 321 to process the workpiece 323. An external pathway 340 can move the workpiece 323 in and out of the process chamber.

Figure 6A:
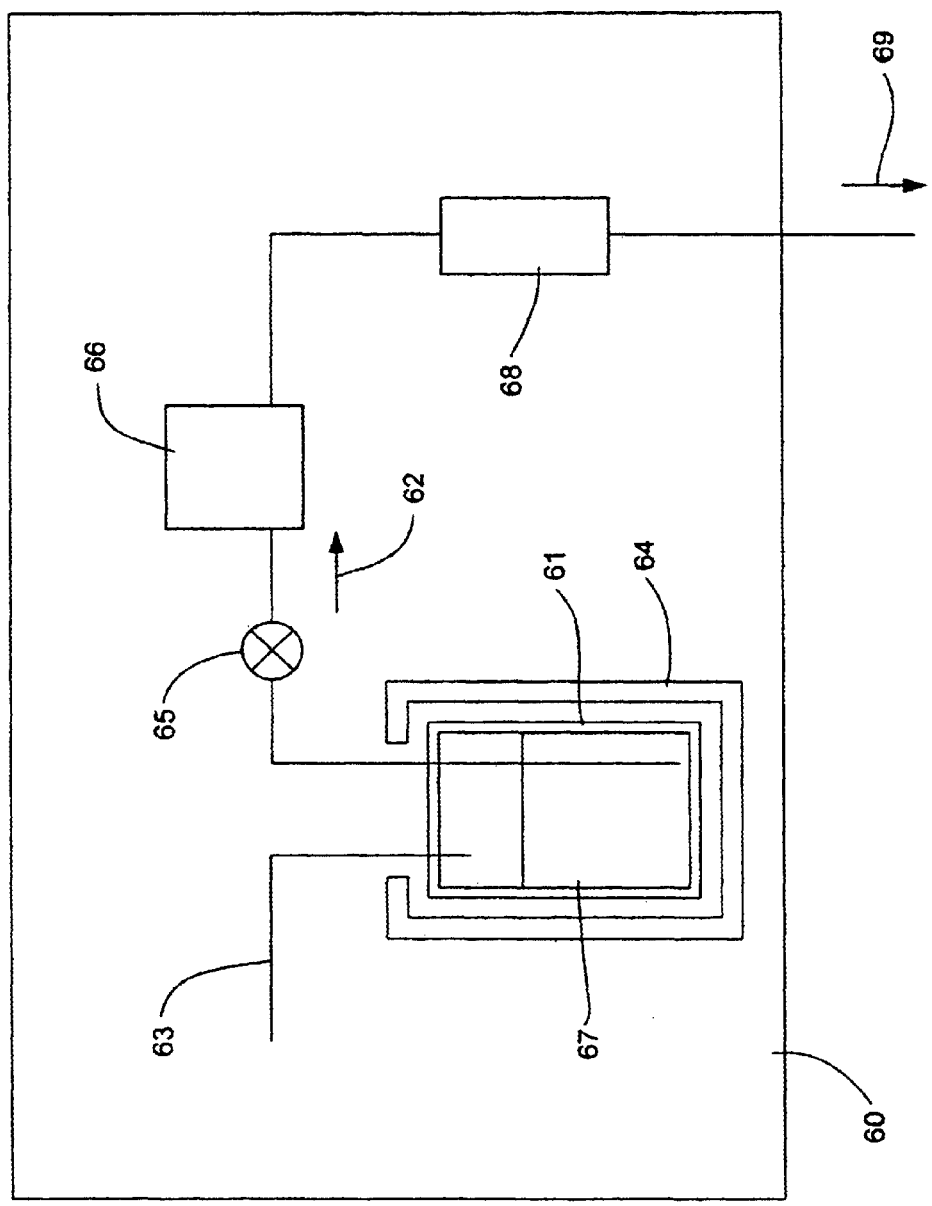
FIGS. 6A–6C show precursor delivery systems.
Figure 6B:
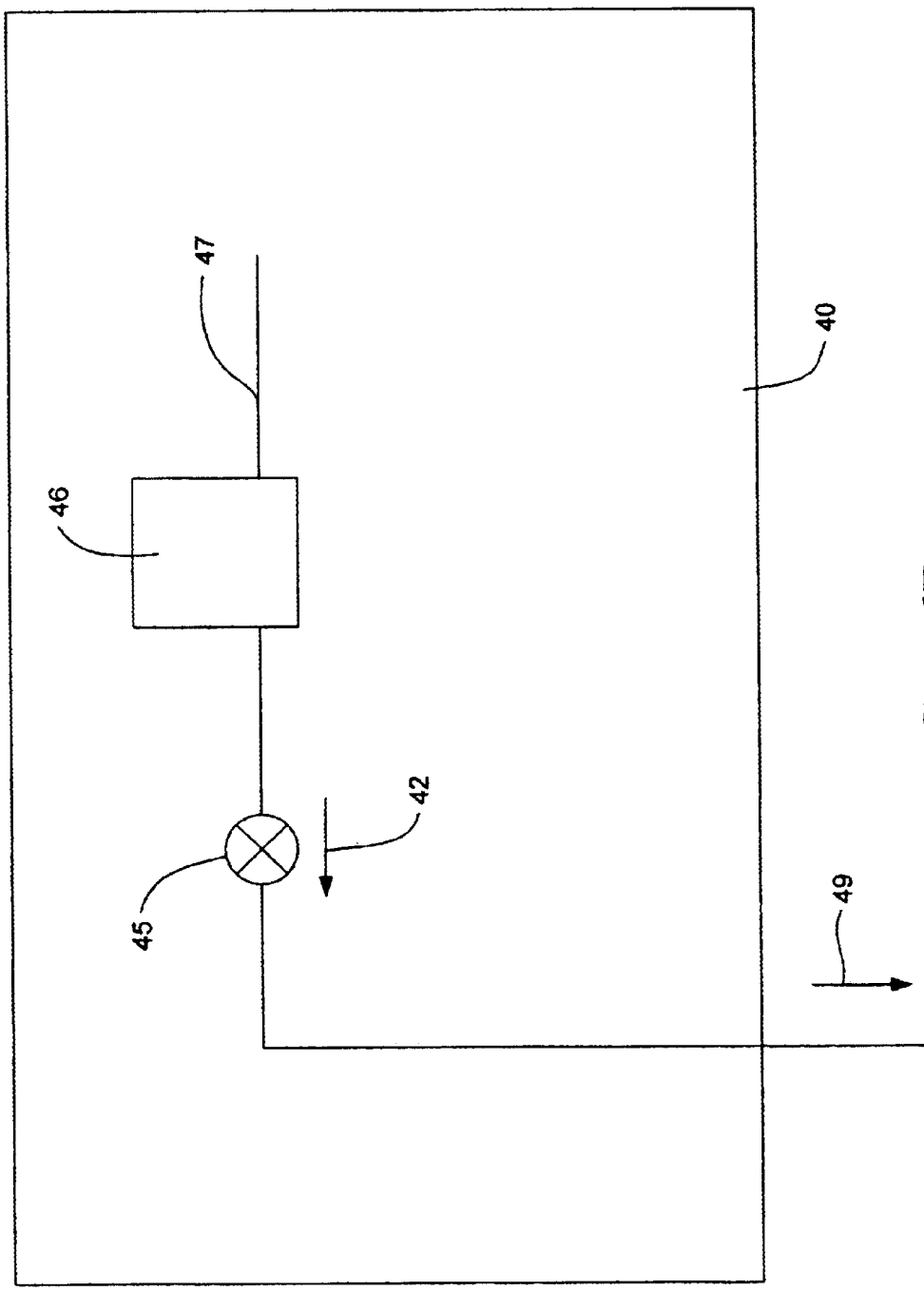
Figure 6C:
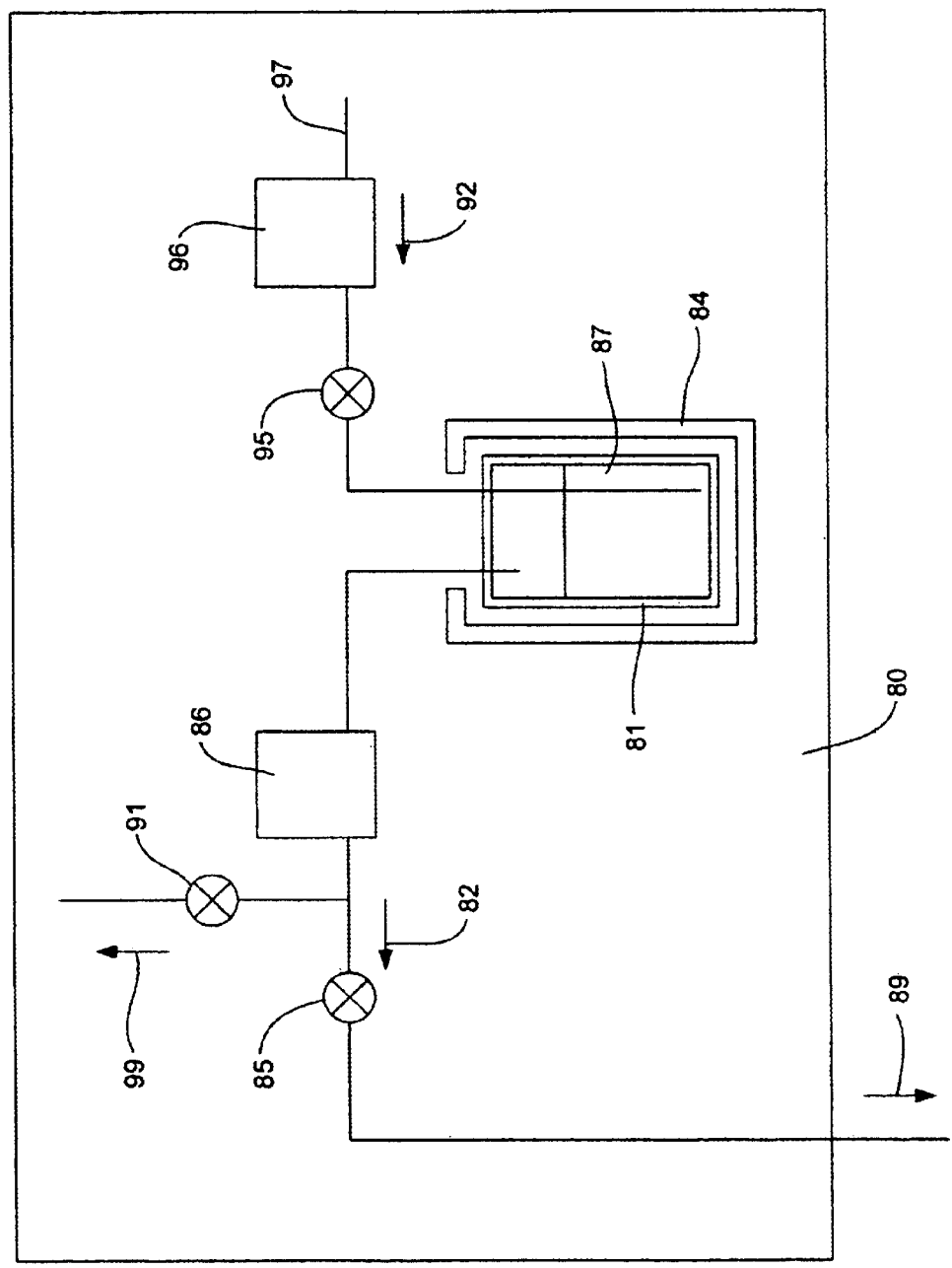

FIGS. 6A–6C show precursor delivery systems. FIG. 6A shows a liquid precursor delivery system 60. The liquid delivery system 60 comprises a container 61 containing the liquid precursor 67. The liquid precursor path 62 comprises a shut off valve 65 to shut off the liquid flow, a metering valve 66 to control the amount of liquid flow, and a vaporizer 68 to convert the liquid into vapor. The liquid precursor is converted to precursor vapor at the outlet of the vaporizer 68 and is delivered to the process chamber. The precursor vapor path 69 starts at the outlet of the vaporizer. The liquid delivery system comprises a liquid precursor path 62 from the liquid container 61 to the vaporizer 68 and a precursor vapor path 69 from the vaporizer 68 to the process chamber. A push gas 63 supplies pressure to the precursor container 61 to push the liquid precursor through the liquid precursor path 62. An optional heater jacket 64 can be used to maintain the temperature of the liquid container. A solid precursor can be dissolved in a solvent, and can be delivered to a process chamber using liquid precursor delivery system. FIG. 6B shows a gas delivery system 40. The precursor gas path 42 comprises a metering valve 46 to control the amount of gas flow and a shut off valve 45 to shut off the gas flow. A precursor gas 47 supplies the precursor at the inlet of the metering valve 46. The precursor gas path 49 that delivers to the process chamber is a continuation of the precursor gas path 42. FIG. 6C shows a vapor precursor delivery system 80. The precursor 87 is contained in a precursor container 81. The precursor 87 can be a liquid precursor or a solid precursor. The precursor vapor travels through the precursor vapor path 82. The precursor vapor path 89 that delivers to the process chamber is a continuation of the precursor vapor path 82. The precursor vapor by-pass path 99 that delivers to a vacuum pump is a by-pass of the precursor vapor path. The precursor vapor by-pass path is used to stabilize the precursor flow. If valve 91 is opened and valve 85 is closed, the precursor follows the by-pass path and is dumped to the vacuum pump. When the valve 91 is closed and valve 85 is opened, the precursor follows the precursor path and deposits into the process chamber. The metering valve 86 controls the amount of precursor vapor that flows through the precursor vapor path 82. A heater jacket 84 controls the vapor pressure of the precursor. A carrier gas 97 can be used to push the precursor vapor through the carrier path 92. A metering valve 96 controls the volume of carrier gas flow and a shut off valve 95 shuts off the carrier gas flow.

It should be realized that the above examples represent a few of a virtually unlimited number of applications of the plasma processing techniques embodied within the scope of the present invention. Furthermore, although the invention has been described with reference to the above specific embodiments, this description is not to be construed in a limiting sense. For example, the duty ratios, cycle times and other parameters/conditions may be changed in order to obtain a desired characteristic for the process on the wafer.

Various modifications of the disclosed embodiment, as well as alternative embodiments of the invention will become apparent to persons skilled in the art upon reference to the above description. The invention, however, is not limited to the embodiment depicted and described. For instance, the radiation source can be a radio frequency heater rather than a lamp. Hence, the scope of the invention is defined by the appended claims. It is further contemplated that the appended claims will cover such modifications that fall within the true scope of the invention.

What is claimed is:

1. An apparatus for sequential and isolated processing of a workpiece, comprising:
   a) a workpiece processing chamber comprising a first compartment and a second compartment, wherein the compartments are separated by an internal pathway, that allows the passage of the workpiece from one compartment to the other compartment;
   b) a workpiece mover to support the workpiece; and
   c) two pathway doors that are coupled to the workpiece mover;
   wherein one pathway door closes the internal pathway when the workpiece mover is in one compartment and the other pathway door closes the internal pathway when the workpiece mover is in the other compartment and wherein the movement of the workpiece mover from one compartment to the other compartment is a rotational movement.

2. An apparatus as in claim 1, wherein the two pathway doors coupled to the workpiece mover are equal or smaller than the internal pathway opening.

3. An apparatus as in claim 1, wherein the two pathway doors coupled to the workpiece mover are larger than the internal pathway opening.

4. An apparatus as in claim 1 further comprising:
   e) a workpiece mover heater coupled to the workpiece mover, the workpiece mover heater being capable of heating the workpiece to an elevated temperature.

5. An apparatus as in claim 1 further comprising an actuator coupled to a linear guide to move the workpiece mover in a vertical direction somewhat perpendicular to the movement from one compartment to the other compartment, the vertical movement being to clear the workpiece mover of any obstacles during the compartment to compartment transfer.

6. An apparatus as in claim 1 further comprising an external pathway coupled to one of the compartment, the external pathway allowing the passage of the workpiece to the outside of the workpiece processing chamber.

7. An apparatus as in claim 1 further comprising a plurality of workpiece heaters coupled to the processing chamber, the workpiece heaters being capable of heating the workpiece to an elevated temperature.

8. An apparatus as in claim 7 further comprising a plurality of second actuators coupled to a plurality of linear guides with the linear guides coupled to the workpiece heaters to move the workpiece heaters in a vertical direction somewhat perpendicular to the compartment to compartment movement, the vertical movement being to clear the workpiece mover of any obstacles during the compartment to compartment transfer.

9. An apparatus as in claim 1 further comprising a plurality of delivery systems coupled to the processing chamber, the delivery systems being capable of delivering a plurality of precursors onto the workpiece.

10. An apparatus as in claim 9, wherein the delivery system is a liquid precursor delivery system to deliver a plurality of precursor vapors from a plurality of liquid precursor sources.

11. An apparatus as in claim 9, wherein the delivery system is a solid precursor delivery system to deliver a plurality of precursor vapors from a plurality of solid precursor sources.

12. An apparatus as in claim 1 further comprising a plurality of plasma sources coupled to the processing chamber, the plasma sources being capable of delivering a plasma onto the workpiece.

13. An apparatus as in claim 12, wherein the plasma source is an inductive coupled plasma source.

14. An apparatus as in claim 12 wherein the plasma source is a remote plasma source.

15. An apparatus as in claim 12, wherein the plasma source is a microwave plasma source.

16. An apparatus as in claim 12, wherein the plasma source is a parallel plate plasma source.

17. An apparatus as in claim 1 further comprising a plurality of vacuum pumps coupled to the processing chamber, the vacuum pumps being capable of maintaining the processing chamber at a pressure lower than atmospheric pressure.

18. An apparatus as in claim 1 further comprising a plurality of workpiece bias power source coupled to the processing chamber, the workpiece bias power source being capable of providing a potential bias to the workpiece.

19. An apparatus as in claim 1 further comprising an actuator coupled to the workpiece mover and to the workpiece processing chamber to move the workpiece mover from one compartment to the other compartment.

20. An apparatus for sequential and isolated processing of a workpiece, comprising:
   a) a workpiece processing chamber comprising a first compartment and a second compartment, wherein the compartments are separated by an internal pathway, that allows the passage of the workpiece from one compartment to the other compartment;
   b) a plurality of workpiece heaters coupled to the processing chamber for heating the workpiece to an elevated temperature;
   c) a plurality of vacuum pumps coupled to the processing chamber for maintaining the processing chamber at a pressure lower than atmospheric pressure;
   d) a plurality of delivery systems coupled to the processing chamber to deliver a plurality of precursors onto the workpiece;
   e) a workpiece mover to support the workpiece;
   f) two pathway doors that are coupled to the workpiece mover;
   g) an actuator coupled to the workpiece mover and to the workpiece processing chamber to move the workpiece mover from one compartment to the other compartment, wherein one pathway door closes the internal pathway when the workpiece mover is in one compartment and the other pathway door closes the internal pathway when the workpiece mover is in the other compartment and wherein the movement of the workpiece mover from one compartment to the other compartment is a rotational movement.

21. An apparatus as in claim 20 wherein the workpiece heater is coupled to the workpiece mover.

22. An apparatus as in claim 20 further comprising a plurality of actuators coupled to a plurality of linear guides with the linear guides coupled to the workpiece heaters to move the workpiece heaters in a vertical direction perpendicular to the compartment to compartment movement, the vertical movement being to clear the workpiece mover of any obstacles during the compartment to compartment transfer.

23. An apparatus as in claim 20, wherein the delivery system is a liquid delivery system to delivery a plurality of precursor vapors from a plurality of liquid precursor sources onto the workpiece.

24. An apparatus as in claim 20, wherein the delivery system is a solid delivery system to delivery a plurality of precursor vapors from a plurality of solid precursor sources onto the workpiece.

25. An apparatus for sequential and isolated processing of a workpiece, comprising:
   a) a workpiece processing chamber comprising a first compartment and a second compartment, wherein the compartments separated are by an internal pathway that allows the passage of the workpiece from one compartment to the other compartment;
   b) a plurality of workpiece heaters coupled to the processing chamber for heating the workpiece to an elevated temperature;
   c) a plurality of vacuum pumps coupled to the processing chamber for maintaining the processing chamber at a pressure lower than atmospheric pressure;
   d) a plurality of delivery systems coupled to the processing chamber to delivery a plurality of precursors onto the workpiece;
   e) a plurality of plasma sources coupled to the processing chamber to generate a plasma in the processing compartments;
   f) a workpiece mover to support the workpiece;
   g) two pathway doors coupled to the workpiece mover;
   h) an actuator coupled to the workpiece mover and to the workpiece processing chamber to move the workpiece mover from one compartment to the other compartment, wherein one pathway door closes the internal pathway when the workpiece mover is in one compartment and the other pathway door closes the internal pathway when the workpiece mover is in the other compartment and wherein the movement of the workpiece mover from one compartment to the other compartment is a rotational movement.

26. An apparatus as in claim 25 wherein the workpiece heater is coupled to the workpiece mover.

27. An apparatus as in claim 25 further comprising a plurality of actuators coupled to a plurality of linear guides with the linear guides coupled to the workpiece heaters to move the workpiece heaters in a vertical direction perpendicular to the compartment to compartment movement, the vertical movement being to clear the workpiece mover of any obstacles during the compartment to compartment transfer.

28. An apparatus as in claim 25, wherein the delivery system comprises a liquid delivery system to delivery a plurality of precursor vapors from a plurality of liquid precursor sources onto the workpiece.

29. An apparatus as in claim 25, wherein the delivery system comprises a solid delivery system to delivery a plurality of precursor vapors from a plurality of solid precursor sources onto the workpiece.

30. An apparatus as in claim 25, wherein the plasma source comprises an inductive coupled plasma source.

31. An apparatus as in claim 25, wherein the plasma source comprises a remote plasma source.

32. An apparatus as in claim 25, wherein the plasma source comprises a microwave plasma source.

33. An apparatus as in claim 25, wherein the plasma source comprises a parallel plate plasma source.

34. An apparatus as claim 25 further comprising a plurality of workpiece bias power sources coupled to the processing chamber to generate a potential bias in the processing compartments.

* * * * *